United States Patent [19]

Tokuno et al.

[11] Patent Number: 5,777,847
[45] Date of Patent: Jul. 7, 1998

[54] MULTICHIP MODULE HAVING A COVER WTIH SUPPORT PILLAR

[75] Inventors: Kenichi Tokuno; Akihiro Dohya, both of Tokyo, Japan

[73] Assignee: NEC Corporation, Tokyo, Japan

[21] Appl. No.: 812,859

[22] Filed: Mar. 6, 1997

Related U.S. Application Data

[63] Continuation of Ser. No. 534,863, Sep. 27, 1995, abandoned.

[51] Int. Cl.[6] ........................................ H05K 7/20
[52] U.S. Cl. ........................ 361/705; 257/713; 361/719
[58] Field of Search ........................... 165/46, 803, 185;
174/16.3; 257/704, 706, 712, 713, 723,
724; 361/688–690, 704, 705, 706, 717–719,
760, 764, 783, 790

[56] References Cited

U.S. PATENT DOCUMENTS

| | | | |
|---|---|---|---|
| 4,658,331 | 4/1987 | Berg | 361/387 |
| 4,673,772 | 6/1987 | Satoh | 174/52 FP |
| 4,914,551 | 4/1990 | Anschel | 361/389 |
| 5,065,273 | 11/1991 | Rajeevakumar | 361/313 |
| 5,305,185 | 4/1994 | Samarov | 361/704 |
| 5,396,403 | 3/1995 | Patel | 361/705 |
| 5,463,529 | 10/1995 | Chia | 361/704 |
| 5,483,098 | 1/1996 | Joiner, Jr. | 257/676 |
| 5,504,653 | 4/1996 | Murphy | 361/704 |
| 5,510,956 | 4/1996 | Suzuki | 361/704 |
| 5,533,256 | 7/1996 | Call | 29/840 |

FOREIGN PATENT DOCUMENTS

| | | | |
|---|---|---|---|
| 3-239396 | 10/1991 | Japan | 361/704 |
| 5190712 | 7/1993 | Japan . | |

OTHER PUBLICATIONS

Semiconductor—Cooling. Berndlmaier, IBM Tech Discl Bull vol. 20 No. 9 Feb. 1978 p. 3452

*Primary Examiner*—Gerald P. Tolin
*Attorney, Agent, or Firm*—Sughrue, Mion, Zinn, Macpeak & Seas, PLLC

[57] ABSTRACT

A multichip module comprises a substrate mounting a plurality of circuit chips, a cover plate positioned over the circuit chips, and at least one pillar member for fixing the cover plate to the substrate to support it. The substrate has a plurality of circuit chips fixed in a predetermined pattern of locations on a side thereof. At least one pillar member fixes the cover plate to the substrate such that the cover plate is positioned over the circuit chips. Since the pillar member is fixed to the substrate at a small area to support the cover plate, the substrate can be prevented from deforming due to a temperature change. In order to secure the covering member, the pillar member is preferably fixed by means of an adhesive, a fit, or screwing.

49 Claims, 7 Drawing Sheets

MULTICHIP MODULE HAVING A COVER WTIH SUPPORT PILLAR

This is a continuation of application Ser. No. 08/534,863 filed Sep. 27, 1995 now abandoned.

BACKGROUND OF THE INVENTION

1. Field of the Invention

The present invention relates to a multichip module having a plurality of semiconductor chips on a substrate, particularly to an improved cover structure for covering the semiconductor chips.

2. Description of the Prior Art

As the development of large-scale integrated circuit (LSI) technology has been made, it is becoming an increasingly important problem to improve the packaging density on a printed circuit board. As a method for improving the packaging density, attention has focused on a multichip module in which a plurality of LSI chips are mounted on a substrate.

FIG. 1 is a schematic sectional view showing a conventional multichip module. A plurality of semiconductor chips 2 are joined by a sealing resin 3 on a substrate 1. The bumps of the semiconductor chip 2 are electrically connected to the connection terminals formed on the substrate 1, respectively. The semiconductor chips 2 on the substrate 1 are covered with a cover 4 which is secured at the peripheral area of the substrate 1. A heat conductive resin 5 is provided between the ceiling of the cover 4 and the upside of each semiconductor chip 2 and the heat generated by the semiconductor chip 2 is released through the heat conductive resin 5 and the cover 4.

The official gazette of Japanese patent Laid-Open No. 1 90712/1993 discloses a structure in which one heat sink is brought into contact with the upside of a plurality of semiconductor chips and the outer periphery of the heat sink is joined with a substrate by a sealing material.

However, the conventional structures as described above have a problem that the substrate is deformed due to the difference in CTE (coefficient of thermal expansion) between the cover (or the heat sink) and the substrate and resultingly, the connection reliability and the cooling performance of semiconductor chips are deteriorated. More specifically, in the case of the structure shown in FIG. 1, the thermal-expansion displacement of the substrate directly deforms the substrate because the periphery of the cover 4 is secured to the substrate 1. For example, since a substrate with a length of 40 millimeter would have a thermal-expansion displacement of approx. 24 micrometer, a vertical displacement of up to approx. 0.5 millimeter occurs due to the difference in CTE between the substrate 1 and the cover 4. When the vertical displacement approaches the above value, the heat conductive resin 5 cannot absorb the displacement and it comes off the semiconductor chip 2 or the cover 4 to cause the performance for cooling the semiconductor chips 2 to greatly deteriorate. To avoid such a disadvantage, it is necessary to equalize the CTE of the cover 4 with that of the substrate 1 and therefore, material selection is greatly restricted.

Moreover, the heat sink disclosed in the official gazette of Japanese Patent Laid-Open No. 190712/1993 is comprised of metal bodies insulated from each other through an insulator, it is more difficult to equalize the CTE of the heat sink with that of the substrate. Therefore, the structure where the substrate and the heat sink are secured at the periphery thereof causes the substrate to be deformed due to a temperature change under the presence of the CTE difference, and thereby a shearing stress occurs at bump joints of each semiconductor chip, causing the connection reliability and the cooling performance of the chip to deteriorate.

A structure is known in which cooling means such as a heat spreader or a large heat sink is set on each semiconductor chip. However, the structure requires a large space and moreover, an excessive force may be applied to the semiconductor chip. Further, it is a larger problem that the substrate cannot be mounted on a mother board by using a suction hand for mounting because the upside of the substrate is irregular or uneven due to semiconductor chips.

SUMMARY OF THE INVENTION

It is an object of the present invention to provide a semiconductor-chip cover structure making it possible to prevent a substrate from deforming due to a temperature change and connect semiconductor chips at a high reliability.

It is another object of the present invention to provide a semiconductor chip module making it possible to efficiently cool semiconductor chips in a small space independently of a temperature change.

The multichip module according to the present invention is comprised of a substrate mounting a plurality of semiconductor chips, a plate positioned over the semiconductor chips, and at least one pillar member for connecting the plate with the substrate with supporting the plate. The substrate has a plurality of circuit chips fixed in a predetermined pattern of locations on a side thereof. Each circuit chip is electrically connected to electrodes of the substrate. The plate, or a covering member, covers the circuit chips, comprising one or more plate element. At least one pillar member fixes the covering member to the substrate such that the covering member is positioned over the circuit chips. Since the pillar member is fixed to the substrate at a small area to support the covering member, the substrate can be prevented from deforming due to a temperature change. In order to secure the covering member, the pillar member is preferably fixed by means of an adhesive, a fit, or screwing.

Preferably, a heat conductive member, having flexibility, is provided between the covering member and the upside of each circuit chip in contact with the both. The heat produced by each circuit chip is conveyed to the covering member through the heat conductive member and then diffused into air. More preferably, a heat spreader is provided between the heat conductive member and the upside of each circuit chip in contact with the both. A fin structure may be employed in the covering member, resulting in increased cooling performance. The covering member is preferably circular.

DETAILED DESCRIPTION OF THE PREFERRED EMBODIMENTS

Figure 2:
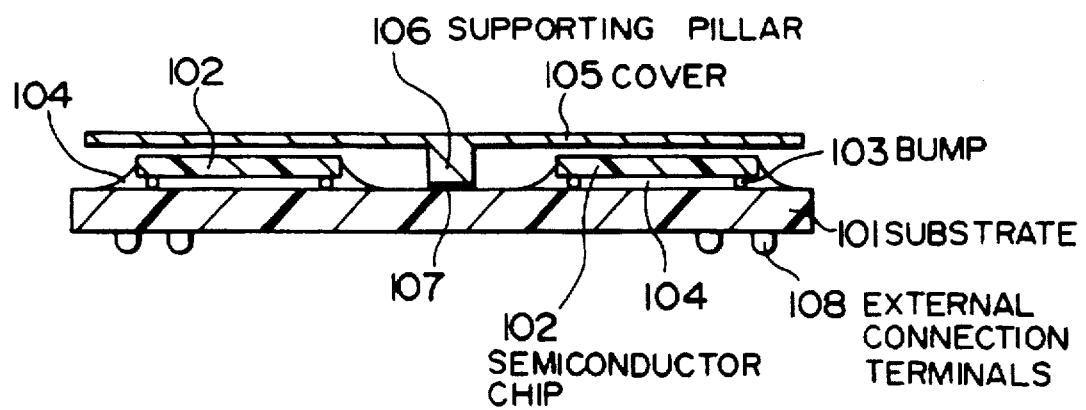
FIG. 2 is a schematic sectional view showing the structure of the first embodiment of the multichip module of the present invention.
Figure 3:
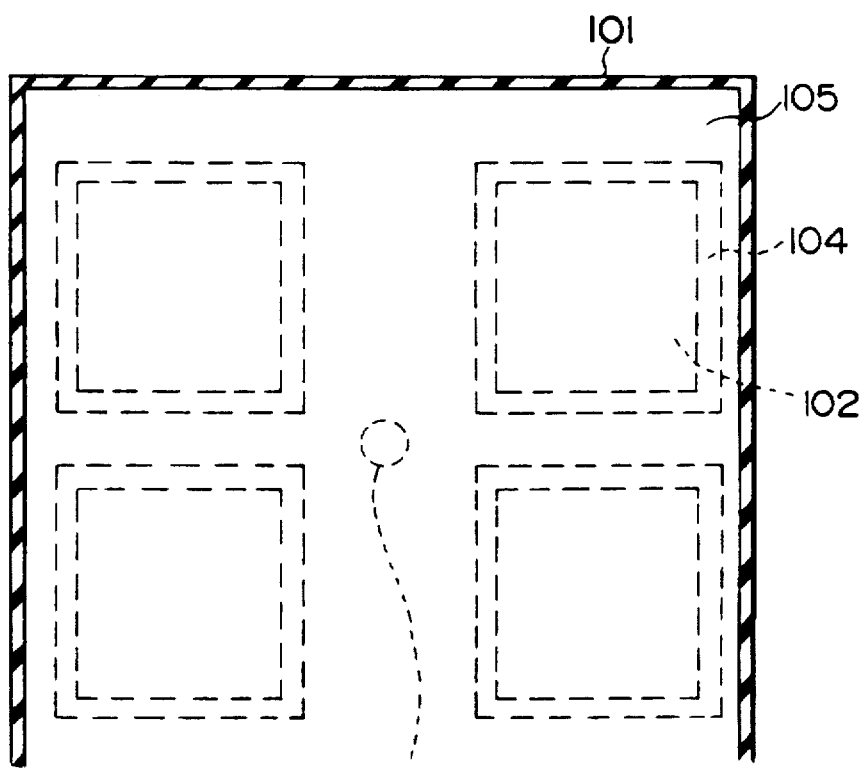
FIG. 3 is a top view of the first embodiment shown in FIG. 2.

As shown in FIGS. 2 and 3, four semiconductor chips 102 each having bumps 103 at predetermined positions are arranged on a substrate 101 and each of the chips 102 is secured to the substrate 101 by a sealing resin 104. The arrangement of the chips 102 may be symmetrical about the center of the substrate 101. A cover 105 having the same shape as the substrate 101 is provided with a support pillar 106 at the central portion thereof and the support pillar 106 is secured to the center (or center of gravity) of the substrate 101 by an adhesive 107. It is possible to integrally form the cover 105 and the support pillar 106 in one piece or secure the support pillar 106 to the flat cover 105. The cover 105 is located above all semiconductor chips 102 to shield them. Moreover, chip connection terminals (not illustrated) for electrically connecting with the bumps 103 are formed on the side of the substrate 101 for arranging the semiconductor chips 102, and external connection terminals 108 are formed on the back surface of the substrate 101, and the chip connection terminals and the external connection terminals 108 are electrically connected to each other by interconnections (not illustrated). To mount this type of the multichip module on a mother board, it is only necessary to set a suction hand to a position nearby the center of the cover 105.

The substrate 101 is comprised of the chip connection terminals, the external connection terminals 108, and an insulator with wiring formed on it. The insulator may use an organic material such as glass epoxy, paper phenol, BT resin, or polyimide or a ceramic material such as glass ceramics. The material of the cover 105 is selected in view of lightness, durability, and heat-radiative property. For example, it is possible to use a metallic material such as aluminum, an aluminum alloy, or copper for the cover 105. Particularly, copper is preferable in view of heat-radiative property because of a high heat conductivity. A thermosetting resin may be used in view of lightness.

This embodiment is manufactured in accordance with the following steps. First, the semiconductor chip 102 is connected onto the glass epoxy substrate 101 by means of flip-chip bonding to seal the gap between the semiconductor chip 102 and the glass epoxy substrate 101 by the epoxy-based sealing resin 104. Then, the support pillar 106 of the aluminum cover 105 is bonded to the central portion of the substrate 101 by the adhesive 107 to secure the cover 105.

By setting the support pillar 106 for securing the cover 105 to the substrate 101 at the center (or center of gravity) of the substrate 101, it is possible to minimize a stress caused by a CTE difference between the cover 105 and the substrate 101. This stress reduction effect is described below in detail.

Figure 1:
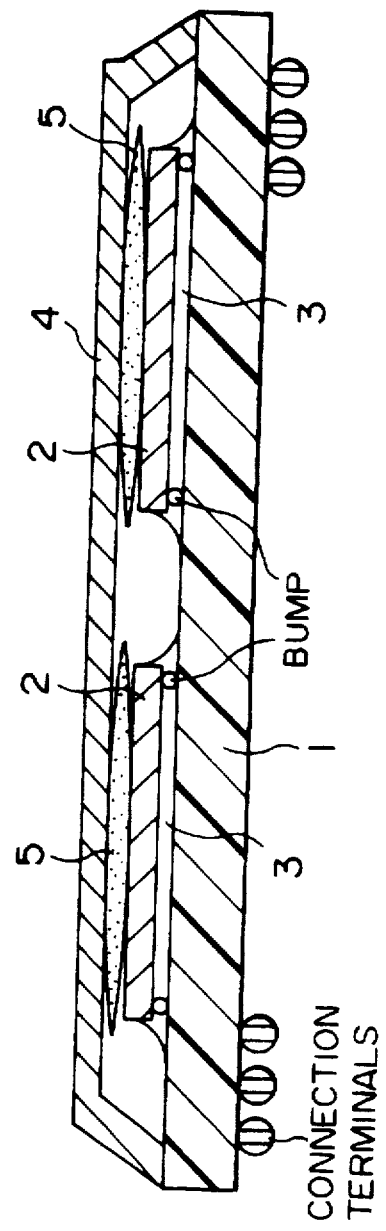
FIG. 1 is a sectional view showing the schematic structure of a conventional multichip module.

As an example, a multichip module is taken in which the substrate 101 made of glass epoxy (CTE: 30 ppm), the cover 105 and the support pillar 106 are made in one piece of aluminum (CTE: 20 ppm), and the diameter of the support pillar 106 is 3 mm. Since the temperature of the semiconductor chip 102 rises up to 85° C. in an actual operational environment in general, the aluminum cover 105 expands by approx. 0.13% and the glass epoxy substrate 101 expands by approx. 0.2%, compared to the length at room temperature, respectively. When assuming the temperature difference from the room temperature to be 60° C., a displacement of approx. 2 μm occurs nearby the support pillar 105 with the diameter of 3 mm. Therefore, the stress caused by a CTE difference between the cover 105 and the substrate 101 is greatly reduced compared with the case of the conventional structure shown in FIG. 1. Moreover, since the edges of the cover 105 are opened, expansion and deformation due to a temperature rise are freely made and no stress occurs to the substrate 101. In short, even if the cover 105 is made of a material with a CTE different from those of the substrate 101 and semiconductor chip 102, it does not cause a stress in the substrate 101 and the semiconductor chip 102.

Figure 4:
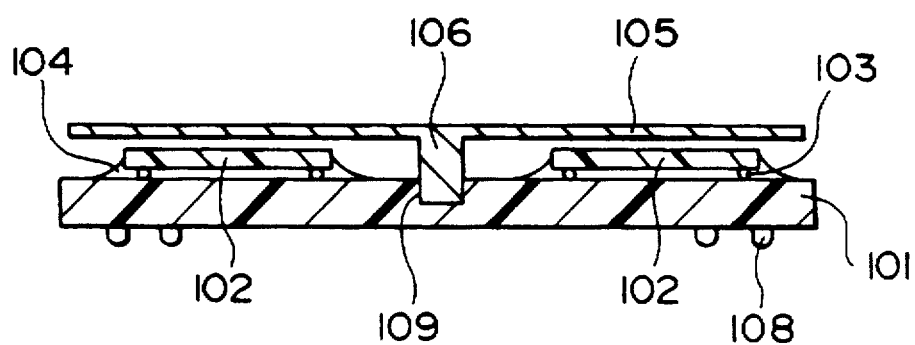
FIG. 4 is a schematic sectional view showing the structure of the second embodiment of the multichip module of the present invention.

FIG. 4 shows a second embodiment of the present invention. In the case of this embodiment, the cover 105 is secured by inserting the support pillar 106 of the cover 105 into a securing hole 109 which is formed at the central portion of the substrate 101. In order to secure the support pillar 106 firmly, the diameter of the cover securing hole 109 is set at a value smaller than that of the support pillar 106 by approx. 0.05 mm. In the case of this embodiment, the cover 105 is secured only by inserting the support pillar 106 of the cover 105 into the securing hole 109, resulting in the simplified manufacturing steps and the reduced manufacturing cost.

Figure 5:
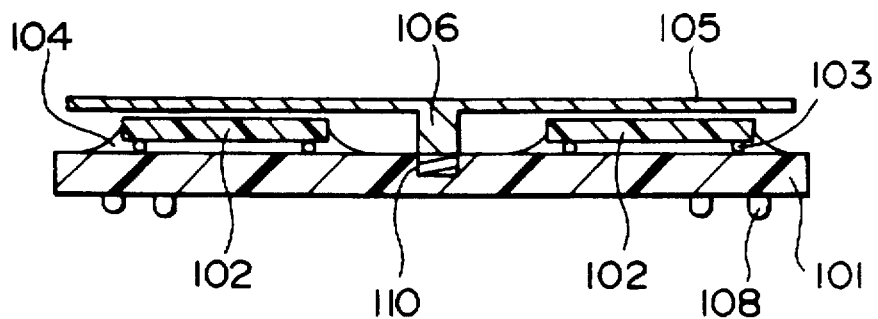
FIG. 5 is a schematic sectional view showing the structure of the third embodiment of the multichip module of the present invention.

FIG. 5 shows a third embodiment of the present invention. In the case of this embodiment, the front end of the support pillar 106 is formed into a threaded structure and a cover securing threaded hole 110 is formed at the central portion of the substrate 101. Moreover, the cover 105 is secured by screwing the support pillar 106 of the cover 105 into the securing threaded hole 110. In the case of this embodiment, the cover 105 can further firmly be secured by using the threaded structure. Moreover, the manufacturing steps are simplified and the manufacturing cost is decreased because the cover 105 can be set only by screwing the support pillar 106 of the cover 105 into the securing threaded hole 110 of the substrate.

Figure 6:
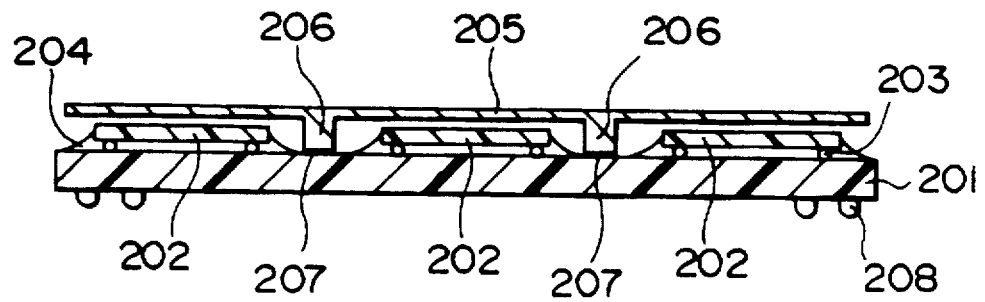
FIG. 6 is a schematic sectional view showing the structure of the fourth embodiment of the multichip module of the present invention.
Figure 7:
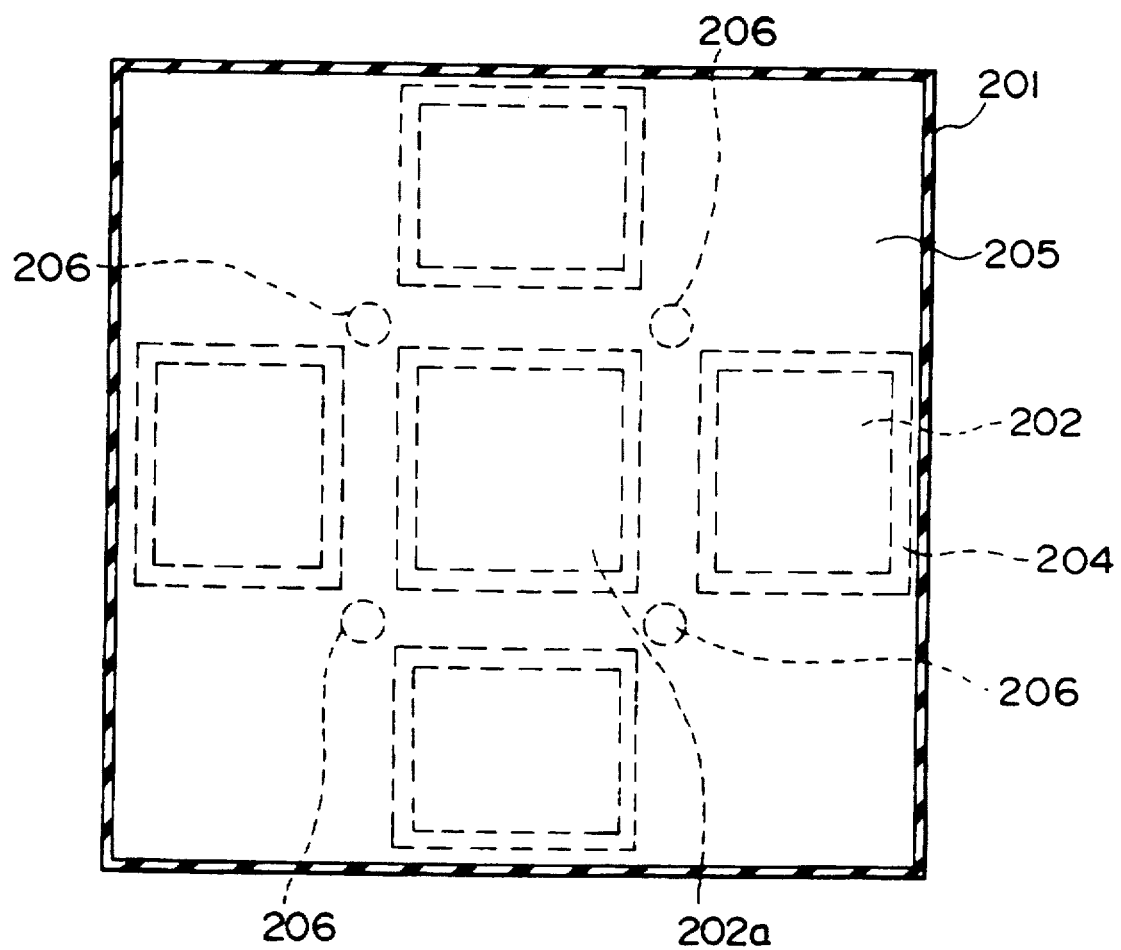
FIG. 7 is a top view of the fourth embodiment shown in FIG. 6.

FIGS. 6 and 7 show a fourth embodiment of the present invention. Among five semiconductor chips 202 each having bumps 203 electrically connected to a substrate 201, four semiconductor chips are adjacently arranged on four sides of a semiconductor chip 202a as shown in FIG. 7. The arrangement of the five chips 202 may be symmetrical about the center of the substrate 201. Each semiconductor chip 202 is secured to the substrate 201 by a sealing resin 204. Four support pillars 206 are set to a cover 205 having the same shape as the substrate 201 and secured by an adhesive 207 so as to surround the semiconductor chip 202a at the center of the substrate 201. The four support pillars 206 are arranged at the central portion of the cover 205 so that their intervals are minimized. The reason is that it is possible to decrease the stress caused by a CTE difference between the substrate 101 and the cover 205. In the case of this embodiment, the four pillars 206 are arranged nearby four corners of the central semiconductor chip 202a as shown in FIG. 7. It is also possible to integrate the cover 205 and the four support pillars 206 in one piece or fix the four support pillars 206 to the flat cover 205.

The cover 205 is located above all semiconductor chips 202 to shield them. Moreover, chip connection terminals (not illustrated) electrically connecting with the bumps 203 are formed at one side of the substrate 201 for arranging the semiconductor chips 202, and external connection terminals 208 are formed at the back surface of the substrate 201, and the chip connection terminals and the external connection terminals 208 are electrically connected by interconnections (not shown). To mount this type of the multichip module on a mother board, it is only necessary to put a suction mounting hand onto a position nearby the center of the cover 105.

The substrate 201 is comprised of the chip connection terminals, the external connection terminals 208, and an insulator with wiring formed on it. The insulator uses an organic material such as glass epoxy, paper phenol, BT resin, or polyimide or a ceramic material such as glass ceramics. The material of the cover 205 is selected in view of lightness, durability, and heat-radiative property. For example, it is possible to use a metallic material such as aluminum, an aluminum alloy, or copper for the cover 205. Particularly, copper is preferable in view of heat-radiative property because of a high heat conductivity. A thermosetting resin may be used in view of lightness.

This embodiment is manufactured in accordance with the following steps. First, the semiconductor chip 202 is connected onto the glass epoxy substrate 201 by means of flip-chip bonding to seal the gap between the semiconductor chip 202 and the glass epoxy substrate 201 by the epoxy-based sealing resin 204. Then, the support pillar 206 of the aluminum cover 205 is bonded to the central portion of the substrate 201 by the adhesive 207 to secure the cover 205.

Figure 8:
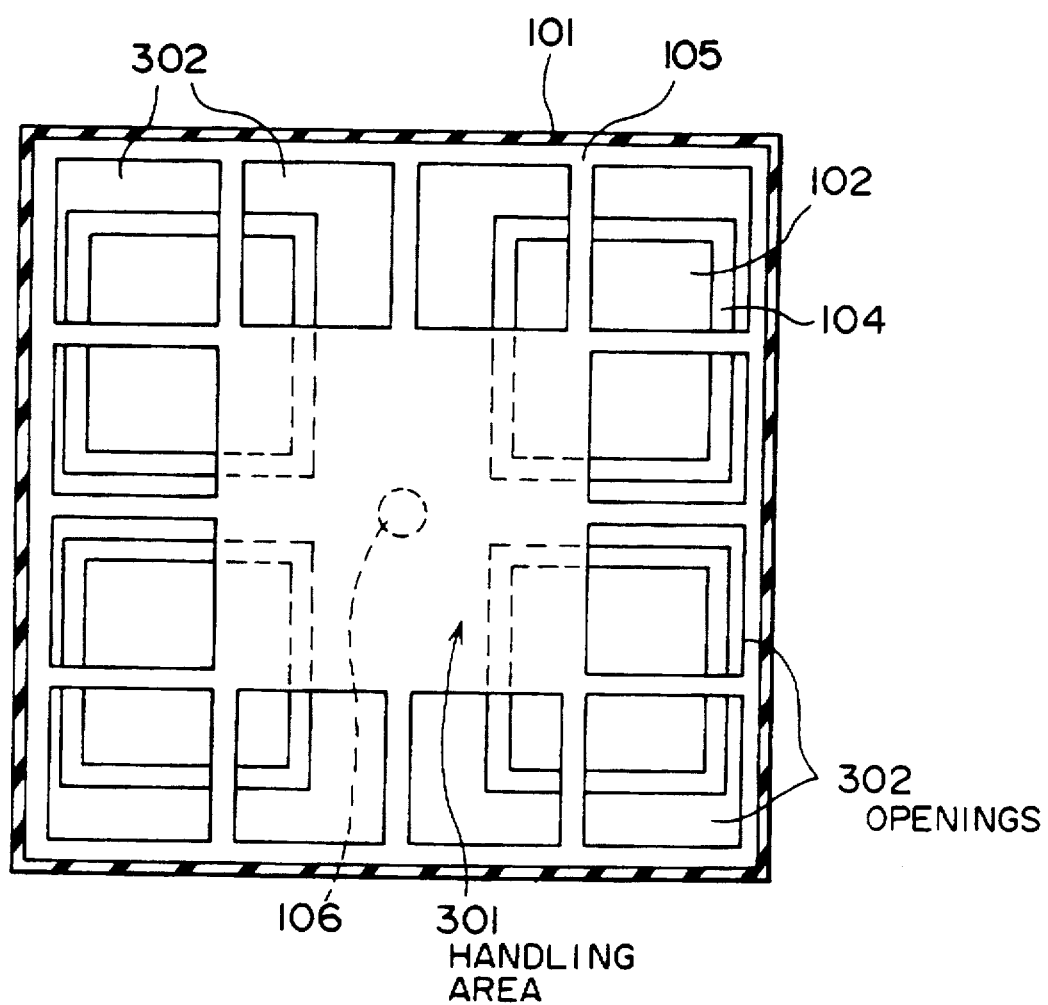
FIG. 8 is a top view of the fifth embodiment of the multichip module of the present invention.

FIG. 8 shows a fifth embodiment of the present invention. In the case of a cover 105 of this embodiment, a handling area 301 is formed at the central portion and openings 302 are formed at other portions. The arrangement of the openings 302 may be symmetrical about the central point of the support pillar 106. As is the case with the first embodiment shown in FIGS. 2 and 3, the cover 105 is secured to the substrate 101 by means of the support pillar 106. To mount the embodiment on a mother board, it is only necessary to move the multichip module by sucking the handling area 301 of the cover 105. The weight of the cover 105 is greatly decreased by forming the openings 302 at the areas other than the central handing area 301.

Figure 9:
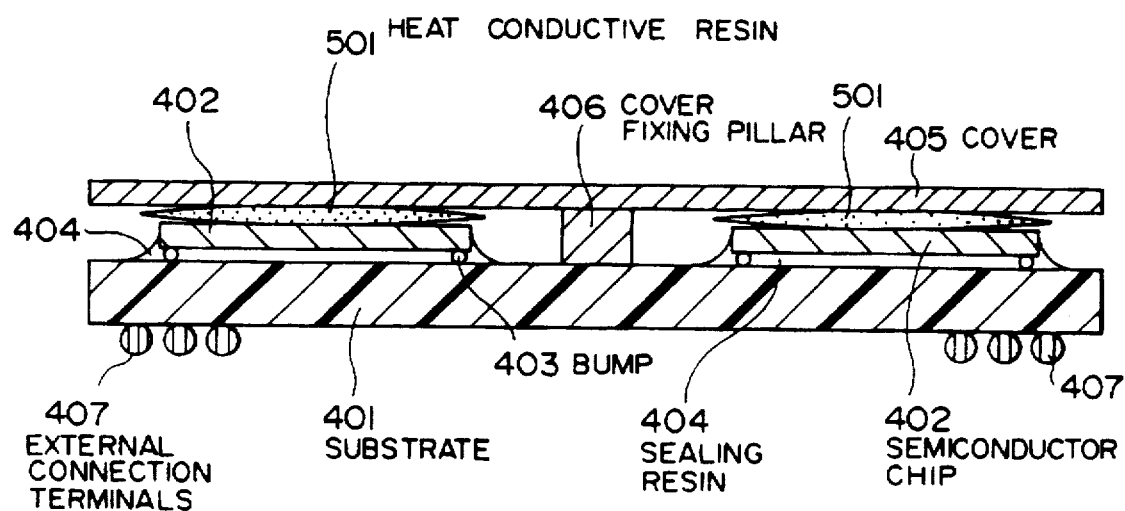
FIG. 9 is a schematic sectional view showing the structure of the sixth embodiment of the multichip module of the present invention.

FIG. 9 is a sectional view showing a sixth embodiment of the present invention. Four semiconductor chips 402 each having bumps 403 are symmetrically arranged on a substrate 401 and each chip 402 is secured to the substrate 401 by a sealing resin 404. A cover securing pillar 406 is provided at the central portion of the cover 405 and is secured to the center (or center of gravity) of the substrate 401. To secure the cover securing pillar 406 to the substrate 401, an adhesive, a fit or screwing can be employed as described in FIGS. 3 to 5. Moreover, this embodiment has a structure in which the cover securing pillar 406 is secured to the cover 405. However, it is also possible to use a structure in which the cover 405 is integrated with the cover securing pillar 406 in one piece. A heat conductive resin 501 is provided between the cover 405 and the upside of the semiconductor chip 402 in contact with the both. The heat produced by the semiconductor chip 402 is conveyed to the cover 405 through the heat conductive resin 501 and then diffused into air.

In addition, chip connection terminals (not illustrated) electrically connecting with the bumps 403, respectively, are formed at the side of the substrate 401 for arranging the semiconductor chips 402, and external connection terminals 407 are formed at the back surface of the substrate 401, and the chip connection terminals and the external connection terminals 407 are electrically connected by interconnections (not illustrated). To mount this type of the multichip module on a mother board, it is only necessary to put a suction mounting hand to a position nearby the center of the cover 405.

The substrate 401 is comprised of the chip connection terminals, the external connection terminals 407, and an insulator with wiring formed on it. The insulator uses an organic material such as glass epoxy, paper phenol, BT resin, or polyimide or a ceramic material such as glass ceramics. The material of the cover 405 is selected in view of lightness, durability, and heat-radiative property. For example, the cover 405 can use a metallic material such as aluminum, an aluminum alloy, or copper. Particularly, copper is preferable in view of heat-radiative property because it has a high heat conductivity. A thermosetting resin may be used in view of lightness.

The heat conductive resin 501 can use a compound made by dispersing fillers with a high heat conductivity (e.g . . . silver, alumina, diamond, silicon carbide, or boron nitride) into a silicone resin, or a silver epoxy resin or silicon rubber. Since these materials are superior in flexibility, they can easily absorb the deformation or irregularity of the surface of the semiconductor chip 402 or the cover 405.

This embodiment is manufactured in accordance with the following steps. First, each semiconductor chip 402 is connected onto the glass epoxy substrate 401 by means of flip-chip bonding to seal the gap between the semiconductor chip 402 and the glass epoxy substrate 401 with the epoxy-based sealing resin 404. Then, the heat conductive resin 501 is put on the upside of each semiconductor chip 402 and the cover securing pillar 406 is secured at the central portion of the substrate 401 so as to shield the heat conductive resin 501 with the aluminum cover 405.

By setting the cover securing pillar 406 for securing the cover 405 to the substrate 401 at the center (or center of gravity) of the substrate 401, it is possible to minimize the stress caused by a CTE difference between the cover 405 and the substrate 401. Particularly, because the flexible heat conductive resin 501 is present between the semiconductor chip 402 and the cover 405, an expansion of the cover 405 due to a temperature change is absorbed by deformation of the heat conductive resin 501 or slip between the cover 405 and the heat conductive resin 501 and thereby, no stress is applied to the semiconductor chip 402.

Moreover, by using a conductive material for the heat conductive resin 501 and forming the cover 405 and the cover securing pillar 406 with copper, it is possible to connect the upside of the semiconductor chip 402 to the minimum potential of the wiring substrate 401. More specifically, a conductive pattern connected to the minimum potential is formed at a joint between the substrate 401 and the cover securing pillar 406 and the cover securing pillar 406 is secured to the substrate 401 so as to electrically connect with the conductive pattern. Since the heat conductive resin 501 is conductive, the upside of the semiconductor chip 402 can be kept at the minimum potential of the circuit. This structure is necessary to perform stable operations for a certain type of an integrated-circuit chip.

It is apparent that the above-mentioned structure in which the heat conductive resin is provided on each semiconductor chip may be also employed in the 5-chip structure as shown in FIGS. 6 and 7.

Figure 10:
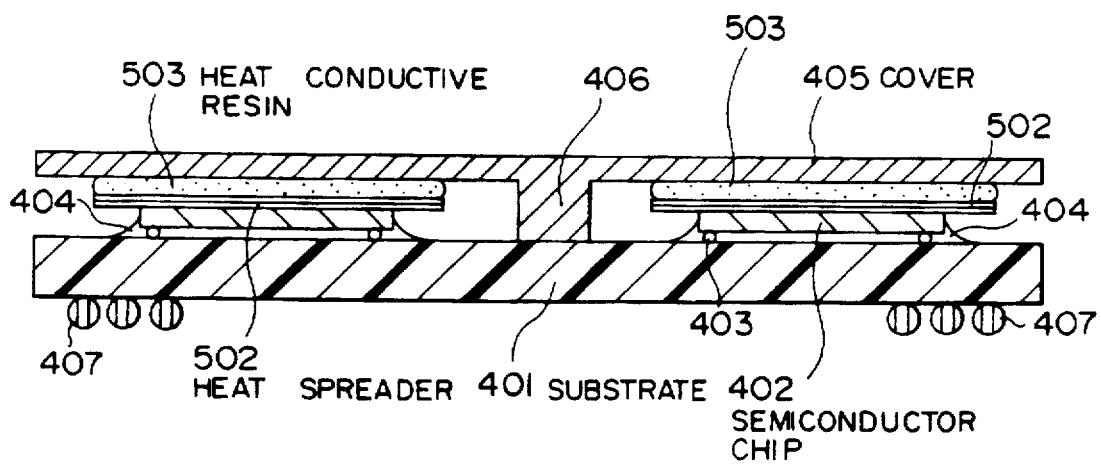
FIG. 10 is a schematic sectional view showing the structure of the seventh embodiment of the multichip module of the present invention.

FIG. 10 is a sectional view showing a seventh embodiment of the present invention. In the case of this embodiment, a heat spreader 502 is secured to the upside of each semiconductor chip 402 and a heat conductive resin 503 is provided between the heat spreader 502 and the cover 405 in contact with the both. Moreover, in the case of this embodiment, the cover 405 is integrated with the cover securing pillar 406 in one piece.

The heat produced by the semiconductor chip 402 is diffused by the heat spreader 502, conveyed to the cover 405 through the heat conductive resin 503, and diffused into air. When the semiconductor chip 402 is relatively small in size but it has a large heating value, it is effective to use the heat spreader 502. The heat spreader 502 has a heat resistance much smaller than that of the heat conductive resin 503. Therefore, the spreader 502 improves the cooling effect because heat quickly diffuses and a heat releasing area expands. The material of the heat spreader 502 uses a metal such as aluminum, an aluminum alloy, copper, a copper alloy, or copper tungsten, or ceramics such as aluminum nitride.

By using aluminum nitride serving as an insulator for the heat spreader 502, it is possible to electrically insulate the upside of the semiconductor chip 402 from the cover 405. This type of the heat spreader 502 is effective when a power-supply voltage Vcc is connected to the upside of the semiconductor chip 402 and the cover 405 is grounded.

Figure 11:
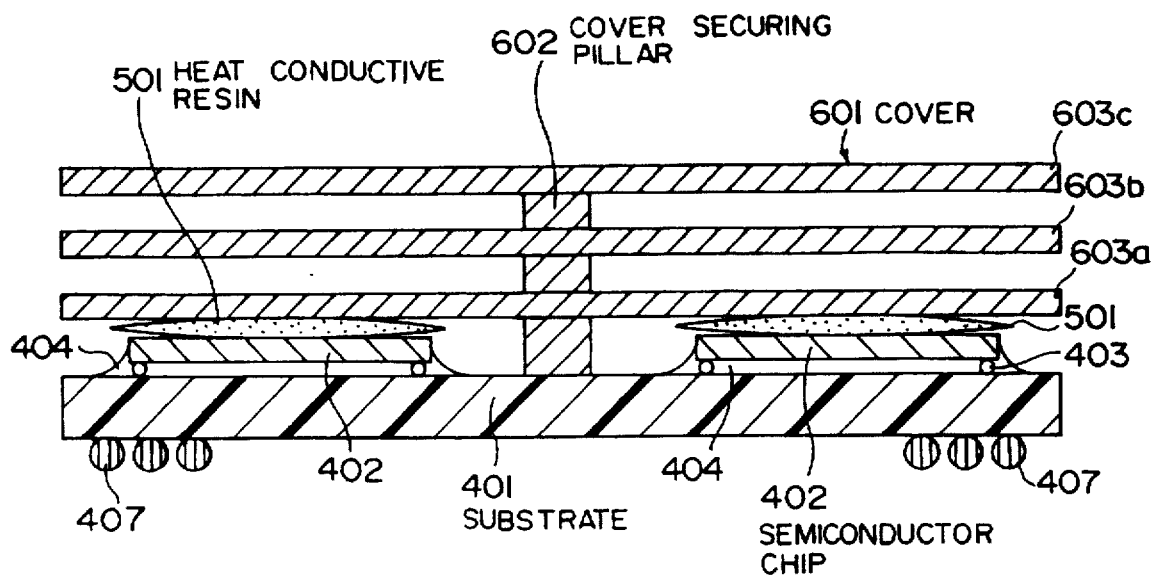
FIG. 11 is a schematic sectional view showing the structure of the eighth embodiment of the multichip module of the present invention.
Figure 12:
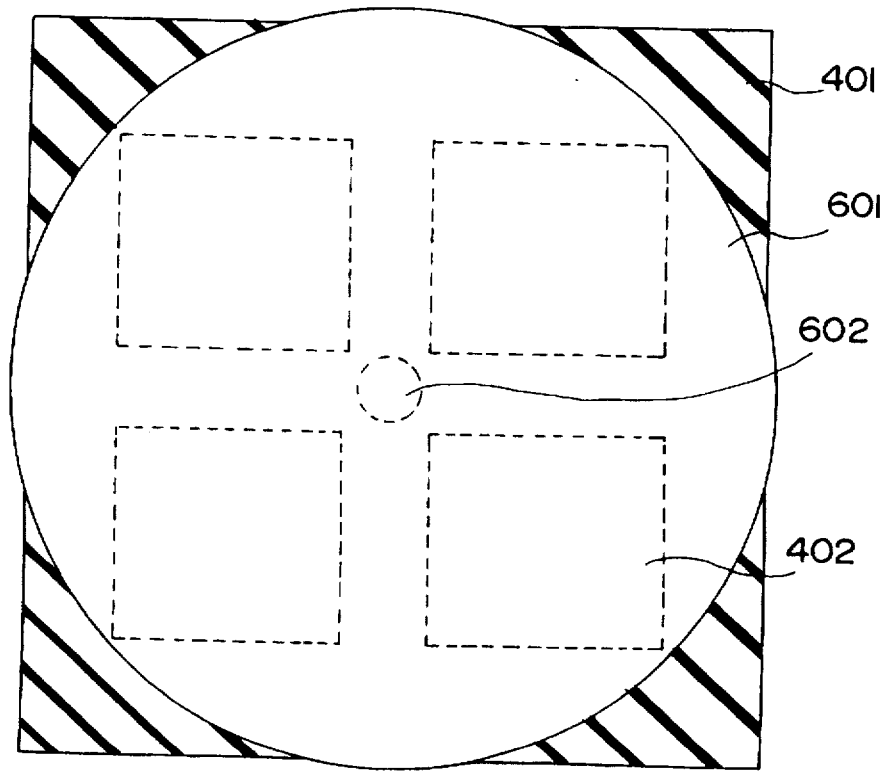
FIG. 12 is a top view of the eighth embodiment shown in FIG. 11.

FIG. 11 is a sectional view showing an eighth embodiment of the present invention. FIG. 12 is a top view of this embodiment. A cover 601 of this embodiment has a heat-releasing fin structure in which a plurality of stages of circular metallic plates 603a to 603c are arranged in parallel about the cover securing pillar 602. The fin-structure cover 601 shields over the semiconductor chips 402 with the cover securing pillar 602 secured to the center of the substrate 401. In this case, since the cover 601 is circular, it is unnecessary to consider the setting direction of the cover 601 and therefore, the step of setting the cover 601 is simplified. When the cover 601 is secured to the substrate 401, the downside of the circular metallic plate 603a at the lowest stage contacts the heat conductive resin 501 provided at the upside of the semiconductor chip 402. The material of the cover 601 uses aluminum, an aluminum alloy, or copper.

The heat produced by the semiconductor chip 402 is conveyed to the lowest-stage metallic plate 603a of the cover 601 through the heat conductive resin 501 and further, conveyed to the upper-stage metallic plates 603b and 603c and diffused into air. Since the cover 601 has a heat-releasing fin structure, a large heat-releasing effect can be obtained. Moreover, since the fin-structure cover 601 is secured to the substrate 401 by the cover securing pillar 602, the weight of the cover 601 is not applied to the semiconductor chip 402. Therefore, it is easy to increase the size of a heat-releasing fin or heat sink. In particular, because one heat sink is set onto a plurality of semiconductor chips 402, turbulence of air flow hardly occurs and the cooling effect can easily be improved. Moreover, as described above, deformation of the substrate 401 due to a CTE difference between the cover 601 and the substrate 401 is greatly decreased compared to the conventional one.

It is apparent that the above-mentioned cover structure as shown in FIGS. 11 and 12 may be also employed in the 5-chip structure as shown in FIGS. 6 and 7.

As described above in detail, the multichip module of the present invention has a structure in which a flat cover is joined with a substrate by at least one support pillar. Therefore, it is possible to greatly decrease the deformation due to a CTE difference between the cover and the substrate and greatly improve the connection reliability of semiconductor chips mounted on the substrate.

Moreover, since a structure is used in which a semiconductor chip contacts a cover through a flexible heat conductive resin, it is possible to efficiently release heat without applying a dynamic load to the substrate. Particularly, because the cover is joined with the substrate only by the support pillar, it is possible to form the cover into a heat sink structure for releasing heat and easily improve the chip cooling performance without applying an unnecessary force to the semiconductor chip.

What is claimed is:

1. A device comprising:
   a substrate having a plurality of circuit chips fixed in a predetermined pattern of locations on a side of said substrate, each of said circuit chips being electrically connected to electrodes of said substrate;
   a cover for covering said circuit chips, said cover comprising at least one plate element; and
   a fixing and supporting means located in a central location of said substrate for fixing said cover to said substrate at a predetermined level over said circuit chips and providing a sole support for said cover, wherein, said fixing and supporting means comprises at least one pillar.

2. The device according to claim 1, wherein said cover is geometrically similar to said substrate.

3. The device according to claim 1, wherein said cover is circular.

4. The device according to claim 1, wherein said cover comprises a handling area at a central area of said cover.

5. The device according to claim 4, wherein said cover further comprises a plurality of openings in areas other than said central area of said cover.

6. The device according to claim 1, wherein said cover comprises a heat-releasing fin.

7. The device according to claim 1, wherein said cover comprises a plurality of plate elements which are arranged in parallel to each other and to said substrate.

8. The device according to claim 1, wherein said cover and said pillar are one integral piece.

9. The device according to claim 1, wherein a single pillar is placed at a center of said substrate and at a center of said cover.

10. The device according to claim 9, wherein said single pillar is placed at the center of gravity of said substrate and at the center of gravity of said cover.

11. The device according to claim 9, wherein said circuit chips are placed symmetrically about said single pillar on said side of said substrate.

12. The device according to claim 1, wherein a plurality of pillars are placed at a central area of said substrate and at a central area of said cover.

13. The device according to claim 12, wherein said central area of said substrate includes the center of gravity of said substrate and said central area of said cover includes the center of gravity of said cover.

14. The device according to claim 12, wherein a certain circuit chip of said circuit chips is placed at a center of said substrate and circuit chips other than said certain circuit chip are placed symmetrically about said certain circuit chip on said side of said substrate.

15. The device according to claim 14, wherein four pillars are placed symmetrically about said certain circuit chip on said side of said substrate.

16. The device according to claim 1, wherein an end of said pillar is fixed to said substrate by an adhesive.

17. The device according to claim 1, wherein said substrate further has at least one fixing hole on said side of said substrate and an end of said pillar is fixed to said substrate by inserting said end of said pillar into said fixing hole.

18. The device according to claim 9, wherein an end of said single pillar is fixed to said substrate by an adhesive.

19. The device according to claim 9, wherein said substrate further has at least one fixing hole on said side of said substrate and an end of said single pillar is fixed to said substrate by inserting said end of said pillar into said fixing hole.

20. The device according to claim 9, wherein:

said substrate further has a single fixing threaded hole on said side of said substrate;

said single pillar is provided with a threaded end; and said single pillar is fixed to said substrate by screwing said single pillar of said cover into said fixing threaded hole of said substrate.

21. The device according to claim 9, wherein said cover is circular.

22. The device according to claim 20, wherein said cover is circular.

23. The device according to claim 12, wherein an end of each said pillar is fixed to said substrate by an adhesive.

24. The device according to claim 12, wherein said substrate further has said plurality of fixing holes on said side of said substrate and an end of each said pillar is fixed to said substrate by inserting said end of each said pillar into each said fixing hole corresponding to said pillar.

25. The device according to claim 12, wherein said cover is circular.

26. The device according to claim 1, wherein said substrate comprises said electrodes and an insulator plate, said insulator comprising an insulating material selected from one of a glass epoxy resin, a phenol resin, a BT resin a polyimide, on glass ceramics.

27. The device according to claim 1, wherein said cover comprises a metallic material selected from aluminum, an aluminum alloy and copper.

28. The device according to claim 1, wherein said cover comprises a thermosetting resin.

29. The device according to claim 1, wherein said pillar comprises a metallic material selected from aluminum, an aluminum alloy and copper.

30. The device according to claim 1, wherein said pillar comprises a thermosetting resin.

31. A device comprising:

a substrate having a plurality of circuit chips fixed in a predetermined pattern of locations on a side of said substrate, each of said circuit chips being electrically connected to electrodes of said substrate;

a heat conductive provided on each said circuit chip, said heat conductive having flexibility;

a cover for cover said circuit chips, said cover comprising at least one plate element; and a fixing and supporting means located in a central location of said substrate for fixing said cover to said substrate at a predetermined level over said substrate and in contact with said heat conductive provided on each of said circuit chips and for providing a sole support for said cover, wherein, said fixing and supporting means comprises at least one pillar.

32. The device according to claim 31, wherein said cover is geometrically similar to said substrate.

33. The device according to claim 31, wherein said cover is circular.

34. The device according to claim 31, wherein said cover comprises a heat-releasing fin.

35. The device according to claim 31, wherein said cover comprises a plurality of plate elements which are arranged in parallel at predetermined intervals.

36. The device according to claim 31, wherein a single pillar is placed at a center of said substrate and at a center of said cover.

37. The device according to claim 36, wherein said circuit chips are placed symmetrically about said single pillar on said side of said substrate.

38. The device according to claim 31, wherein a plurality of pillars are placed at a central area of said substrate and at a central area of said cover.

39. The device according to claim 38, wherein a certain circuit chip of said circuit chips is placed at a center of said substrate and circuit chips other than said certain circuit chip are placed symmetrically about said certain circuit chip on said side of said substrate.

40. The device according to claim 39, wherein four pillars are placed symmetrically about said certain circuit chip on said side of said substrate.

41. The device according to claim 31, wherein an end of said pillar is fixed to said substrate by an adhesive.

42. The device according to claim 31, wherein said substrate further has at least one fixing hole on said side of said substrate and an end of said pillar is fixed to said substrate by inserting said end of said pillar into said fixing hole.

43. The device according to claim 36, wherein:

said substrate further has a single fixing threaded hole on said side of said substrate;

said single pillar is provided with a threaded end; and said single pillar is fixed to said substrate by screwing said single pillar of said cover into said fixing threaded hole of said substrate.

44. The device according to claim 31, wherein said cover is circular.

45. The device according to claim 43, wherein said cover is circular.

46. The device according to claim 31, further comprising a heat spreader which is a plate of material having a heat conductivity smaller than said heat conductive, said heat spreader being provided between said heat conductive and each said circuit chip.

47. The device according to claim 31, wherein said heat conductive comprises a resin containing a filler with a high heat conductivity, said filler comprising a material selected from silver, alumina, diamond, silicon carbide and boron nitride, said resin comprising one of a silicone resin, a silver epoxy resin and silicon rubber.

48. The device according to claim 46, wherein said heat spreader comprises a metal selected from aluminum, an aluminum alloy, copper, a copper alloy, and copper tungsten.

49. The device according to claim 46, wherein said heat spreader comprises aluminum nitride.

* * * * *